(12) United States Patent
Wu et al.

(10) Patent No.: US 10,381,248 B2
(45) Date of Patent: *Aug. 13, 2019

(54) AUTO-CORRECTION OF ELECTROSTATIC CHUCK TEMPERATURE NON-UNIFORMITY

(71) Applicant: Lam Research Corporation, Fremont, CA (US)

(72) Inventors: Benny Wu, Fremont, CA (US); Eric A. Pape, Campbell, CA (US); Keith William Gaff, Fremont, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 564 days.

This patent is subject to a terminal disclaimer.

(21) Appl. No.: 14/859,951

(22) Filed: Sep. 21, 2015

(65) Prior Publication Data

US 2016/0372352 A1 Dec. 22, 2016

Related U.S. Application Data

(60) Provisional application No. 62/182,905, filed on Jun. 22, 2015.

(51) Int. Cl.
*H01L 21/67* (2006.01)
*H01L 21/683* (2006.01)
(Continued)

(52) U.S. Cl.
CPC ...... *H01L 21/67248* (2013.01); *H01L 21/324* (2013.01); *H01L 21/6831* (2013.01); *H01L 22/12* (2013.01); *H01J 2237/2001* (2013.01)

(58) Field of Classification Search
CPC ............ G01R 31/2831; G01R 31/2865; G01R 31/2874; G01R 31/2891; H01L 21/67248; H01L 21/6831; H01L 22/12; H01L 21/324; H01L 22/20; G05B 13/042; G05B 15/02; G05B 19/404; G05B 2219/49206; G05B 2219/49219; H01J 37/32724;
(Continued)

(56) References Cited

U.S. PATENT DOCUMENTS 4,503,335 A    3/1985  Takahashi
5,475,610 A  * 12/1995  Atwood ............... B01L 3/50851
                                                        422/943

(Continued)

*Primary Examiner* — Crystal J Barnes-Bullock

(57) ABSTRACT

A system for controlling a temperature of a wafer processing substrate includes memory that stores first data indicative of first temperature responses of at least one first thermal control element. The first data corresponds to the first temperature responses as observed when a first control parameter of the at least one first thermal control element is maintained at a first predetermined first value. A first controller receives a setpoint temperature for the wafer processing substrate and maintains the first control parameter of the at least one first thermal control element at a second value based on the received setpoint temperature. A second controller retrieves the first data from the memory, calculates second data indicative of temperature non-uniformities associated with the wafer processing substrate based on the first data and the second value, and controls a plurality of second thermal control elements based on the calculated second data.

14 Claims, 4 Drawing Sheets

(51) Int. Cl.
  *H01L 21/324* (2006.01)
  *H01L 21/66* (2006.01)

(58) Field of Classification Search
  CPC ..... H01J 2237/2001; H05B 1/00; H05B 1/02; H05B 1/0233; H05B 3/20; H05B 2213/03
  See application file for complete search history.

(56) References Cited

U.S. PATENT DOCUMENTS

| | | | |
|---|---|---|---|
| 5,667,622 A | | 9/1997 | Hasegawa et al. |
| 5,810,933 A | * | 9/1998 | Mountsier ......... H01L 21/67109 118/500 |
| 6,091,060 A | * | 7/2000 | Getchel ............ H01L 21/67248 118/725 |
| 6,191,394 B1 | * | 2/2001 | Shirakawa ........ H01L 21/67103 118/724 |
| 6,259,072 B1 | * | 7/2001 | Kinnard ........... H01L 21/67115 118/725 |
| 6,342,691 B1 | * | 1/2002 | Johnsgard ............... C30B 31/12 118/50.1 |
| 6,644,965 B2 | * | 11/2003 | Ookura ............ H01L 21/67248 118/725 |
| 6,967,177 B1 | | 11/2005 | May et al. |
| 7,415,312 B2 | * | 8/2008 | Barnett, Jr. ......... G05D 23/1931 219/390 |
| 7,897,897 B2 | * | 3/2011 | Jyousaka ........... G05D 23/1932 219/482 |
| 7,952,049 B2 | * | 5/2011 | Tsukamoto ....... H01L 21/67109 118/724 |
| 8,092,639 B2 | * | 1/2012 | Buchberger, Jr. ........................... H01L 21/67109 118/695 |
| 8,461,674 B2 | | 6/2013 | Gaff et al. |
| 8,546,732 B2 | | 10/2013 | Singh |
| 8,587,113 B2 | | 11/2013 | Gaff et al. |
| 8,608,900 B2 | * | 12/2013 | Buchberger, Jr. ........................... H01L 21/67109 118/708 |
| 8,624,168 B2 | | 1/2014 | Gaff et al. |
| 8,637,794 B2 | | 1/2014 | Singh et al. |
| 8,642,480 B2 | | 2/2014 | Gaff et al. |
| 8,680,441 B2 | | 3/2014 | Singh |
| 8,691,598 B1 | * | 4/2014 | McWhirter ........ B23K 26/0066 372/33 |
| 8,755,204 B2 | | 6/2014 | Benjamin |
| 8,791,392 B2 | | 7/2014 | Singh |
| 8,809,747 B2 | | 8/2014 | Pease et al. |
| 8,809,774 B2 | | 8/2014 | Vertes et al. |
| 8,852,964 B2 | | 10/2014 | Kimura et al. |
| 8,884,194 B2 | | 11/2014 | Singh et al. |
| 9,089,007 B2 | * | 7/2015 | Yang ...................... H05B 3/12 |
| 9,123,755 B2 | * | 9/2015 | Swanson ........... H01L 21/67103 |
| 9,245,768 B2 | * | 1/2016 | Aderhold ............. H01L 21/324 |
| 9,779,974 B2 | * | 10/2017 | Zhang ................. H01L 21/6831 |
| 2001/0019741 A1 | | 9/2001 | Inaba et al. |
| 2002/0003037 A1 | * | 1/2002 | Cousineau ........... B23Q 11/126 165/278 |
| 2002/0030047 A1 | | 3/2002 | Shao et al. |
| 2002/0062954 A1 | * | 5/2002 | Getchel ................ B23Q 11/126 165/263 |
| 2003/0155939 A1 | * | 8/2003 | Lutz .................... G01R 31/2865 324/750.09 |
| 2003/0186545 A1 | * | 10/2003 | Kamp ................ H01L 21/31116 438/689 |
| 2004/0012404 A1 | | 1/2004 | Feder et al. |
| 2004/0156625 A1 | | 8/2004 | Garmer et al. |
| 2005/0098535 A1 | | 5/2005 | Lansford et al. |
| 2005/0099758 A1 | | 5/2005 | Kellerman et al. |
| 2005/0173403 A1 | | 8/2005 | Benjamin et al. |
| 2006/0051077 A1 | | 3/2006 | Kubo |
| 2006/0084188 A1 | | 4/2006 | You et al. |
| 2007/0251456 A1 | * | 11/2007 | Herchen ........... H01L 21/67109 118/724 |
| 2008/0023656 A1 | * | 1/2008 | Quach ................... G03F 7/7075 250/492.22 |
| 2008/0073335 A1 | | 3/2008 | Tsukamoto |
| 2008/0142500 A1 | | 6/2008 | Tomita et al. |
| 2008/0170969 A1 | | 7/2008 | Yoshioka et al. |
| 2008/0230866 A1 | | 9/2008 | Kulp |
| 2009/0008381 A1 | | 1/2009 | Jyousaka et al. |
| 2009/0110824 A1 | * | 4/2009 | Takenaga ............... C23C 16/481 427/248.1 |
| 2010/0332013 A1 | | 12/2010 | Choi et al. |
| 2011/0143462 A1 | * | 6/2011 | Gaff .................. H01L 21/67248 438/9 |
| 2011/0186545 A1 | | 8/2011 | Mahadeswaraswamy et al. |
| 2012/0112068 A1 | | 5/2012 | Maeda et al. |
| 2012/0185103 A1 | | 7/2012 | Blair et al. |
| 2013/0167769 A1 | * | 7/2013 | Shamoun ................. C30B 25/10 117/86 |
| 2014/0073066 A1 | | 3/2014 | Tabuchi |
| 2014/0154819 A1 | * | 6/2014 | Gaff .................. H01L 21/67109 438/17 |
| 2014/0166632 A1 | * | 6/2014 | McWhirter ........ B23K 26/0066 219/121.61 |
| 2014/0220709 A1 | * | 8/2014 | Kimura ............. H01L 21/67248 438/5 |
| 2015/0060013 A1 | * | 3/2015 | Buchberger, Jr. ........................... H01J 37/32724 165/64 |
| 2015/0071623 A1 | | 3/2015 | Ranish |
| 2015/0132863 A1 | | 5/2015 | Oohashi |
| 2015/0170917 A1 | | 6/2015 | Ho et al. |
| 2015/0170934 A1 | | 6/2015 | Aderhold |
| 2015/0176928 A1 | | 6/2015 | Tabuchi |
| 2015/0340255 A1 | | 11/2015 | Parkhe et al. |
| 2016/0027678 A1 | | 1/2016 | Parkhe et al. |
| 2016/0086818 A1 | | 3/2016 | Hamano et al. |
| 2016/0225645 A1 | | 8/2016 | Koizumi et al. |
| 2016/0345384 A1 | * | 11/2016 | Zhang ................. H05B 1/0233 |
| 2016/0370788 A1 | * | 12/2016 | Bailey, III ........ H01L 21/67248 |
| 2017/0133251 A1 | | 5/2017 | Wu et al. |
| 2017/0215230 A1 | | 7/2017 | Parkhe |

\* cited by examiner

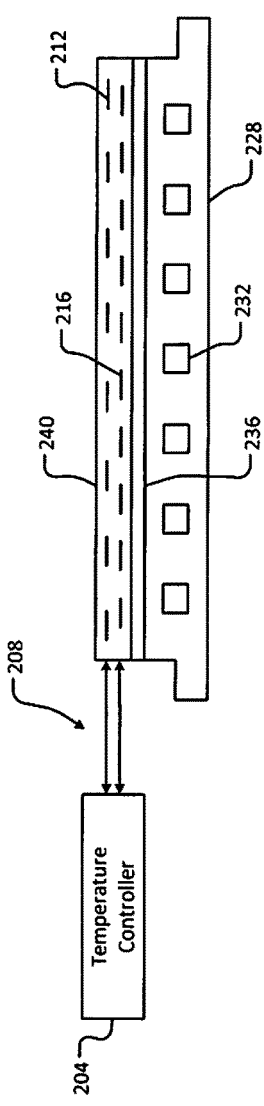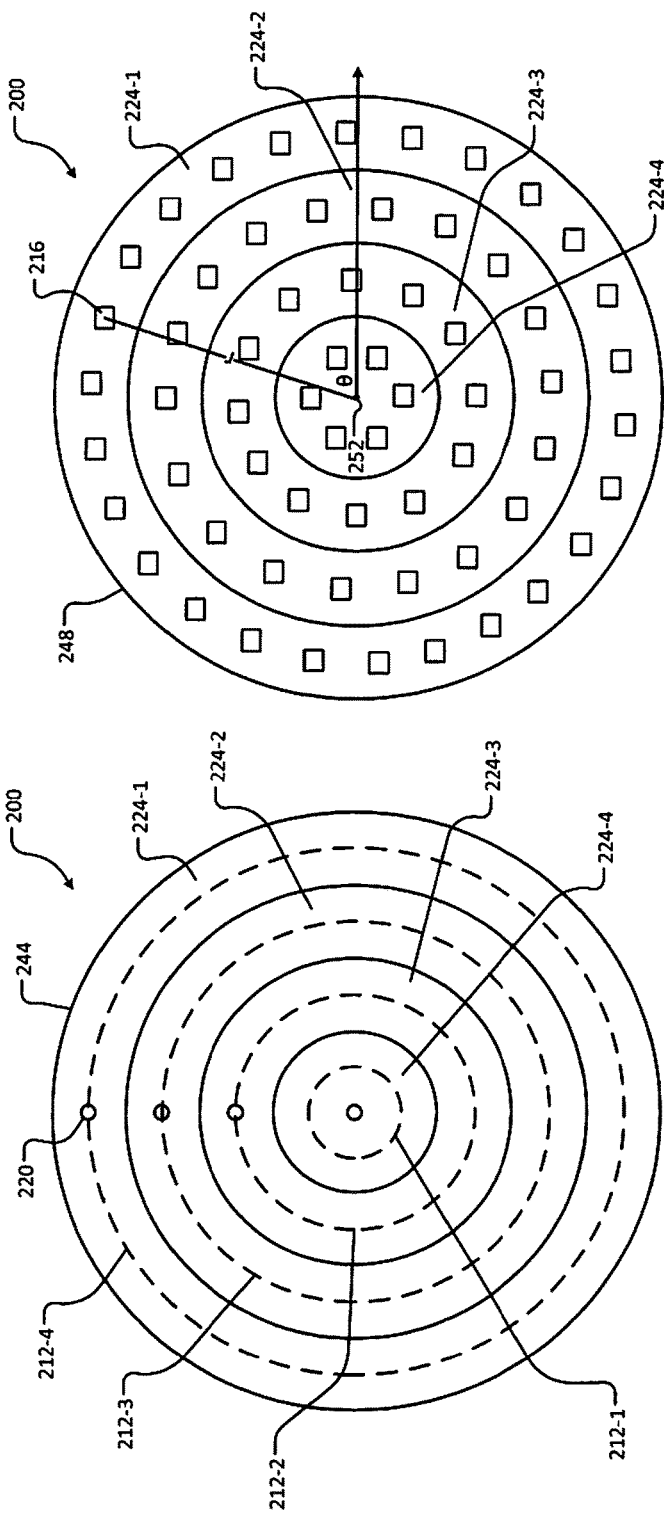

AUTO-CORRECTION OF ELECTROSTATIC CHUCK TEMPERATURE NON-UNIFORMITY

CROSS-REFERENCE TO RELATED CASES

This application claims the benefit of U.S. Provisional Application No. 62/182,905, filed Jun. 22, 2015. The entire disclosure of the application referenced above is incorporated herein by reference.

FIELD

The present disclosure relates to substrate processing systems, and more particularly to systems and methods for controlling the temperature of an electrostatic chuck in a substrate processing system.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform etching, deposition, and/or other treatment of substrates such as semiconductor wafers. Example processes that may be performed on a substrate include, but are not limited to, a plasma enhanced chemical vapor deposition (PECVD) process, a chemically enhanced plasma vapor deposition (CEPVD) process, a sputtering physical vapor deposition (PVD) process, an ion implantation process, and/or other etch (e.g., chemical etch, plasma etch, reactive ion etch, etc.), deposition, and cleaning processes. A substrate may be arranged on a wafer processing substrate, such as a pedestal, an electrostatic chuck (ESC), etc. in a processing chamber of the substrate processing system. For example, during etching, a gas mixture including one or more precursors is introduced into the processing chamber and plasma is struck to etch the substrate.

During process steps, temperatures of various components of the system, and the substrate itself, may vary. These temperature variations may have undesirable effects on the resulting substrates (e.g., non-uniform critical dimensions). In some implementations, temperature variations may result in desirable effects on the substrates. For example, if substrate non-uniformity is present prior to etching, spatial control of temperature and the etching process may be used to correct for non-uniformities. Accordingly, substrate processing systems may implement various systems and methods for controlling temperatures of various components and the substrates during processing.

SUMMARY

A system for controlling a temperature of a wafer processing substrate includes memory, a first controller, and a second controller. The wafer processing substrate includes at least one first thermal control element arranged within the wafer processing substrate and a plurality of second thermal control elements arranged throughout the wafer processing substrate. The memory stores first data indicative of first temperature responses of the at least one first thermal control element. The first data corresponds to the first temperature responses as observed when a first control parameter of the at least one first thermal control element is maintained at a first predetermined first value. The first controller receives a setpoint temperature for the wafer processing substrate and maintains the first control parameter of the at least one first thermal control element at a second value based on the received setpoint temperature. The second controller retrieves the first data from the memory, calculates second data indicative of temperature non-uniformities associated with the wafer processing substrate based on the first data and the second value, and controls the plurality of second thermal control elements based on the calculated second data.

A method for controlling a temperature of a wafer processing substrate including at least one first thermal control element arranged within the wafer processing substrate and a plurality of second thermal control elements arranged throughout the wafer processing substrate includes storing, in memory, first data indicative of first temperature responses of the at least one first thermal control element. The first data corresponds to the first temperature responses as observed when a first control parameter of the at least one first thermal control element is maintained at a first predetermined first value. The method further includes receiving a setpoint temperature for the wafer processing substrate and maintaining the first control parameter of the at least one first thermal control element at a second value based on the received setpoint temperature, retrieving the first data from the memory, calculating second data indicative of temperature non-uniformities associated with the wafer processing substrate based on the first data and the second value, and controlling the plurality of second thermal control elements based on the calculated second data.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 2A is an example electrostatic chuck according to the principles of the present disclosure;

FIG. 2B illustrates zones and macro thermal control elements of an example electrostatic chuck according to the principles of the present disclosure;

FIG. 2C illustrates zones and micro thermal control elements of an example electrostatic chuck according to the principles of the present disclosure;

In the drawings, reference numbers may be reused to identify similar and/or identical elements.

DETAILED DESCRIPTION

Figure 1:
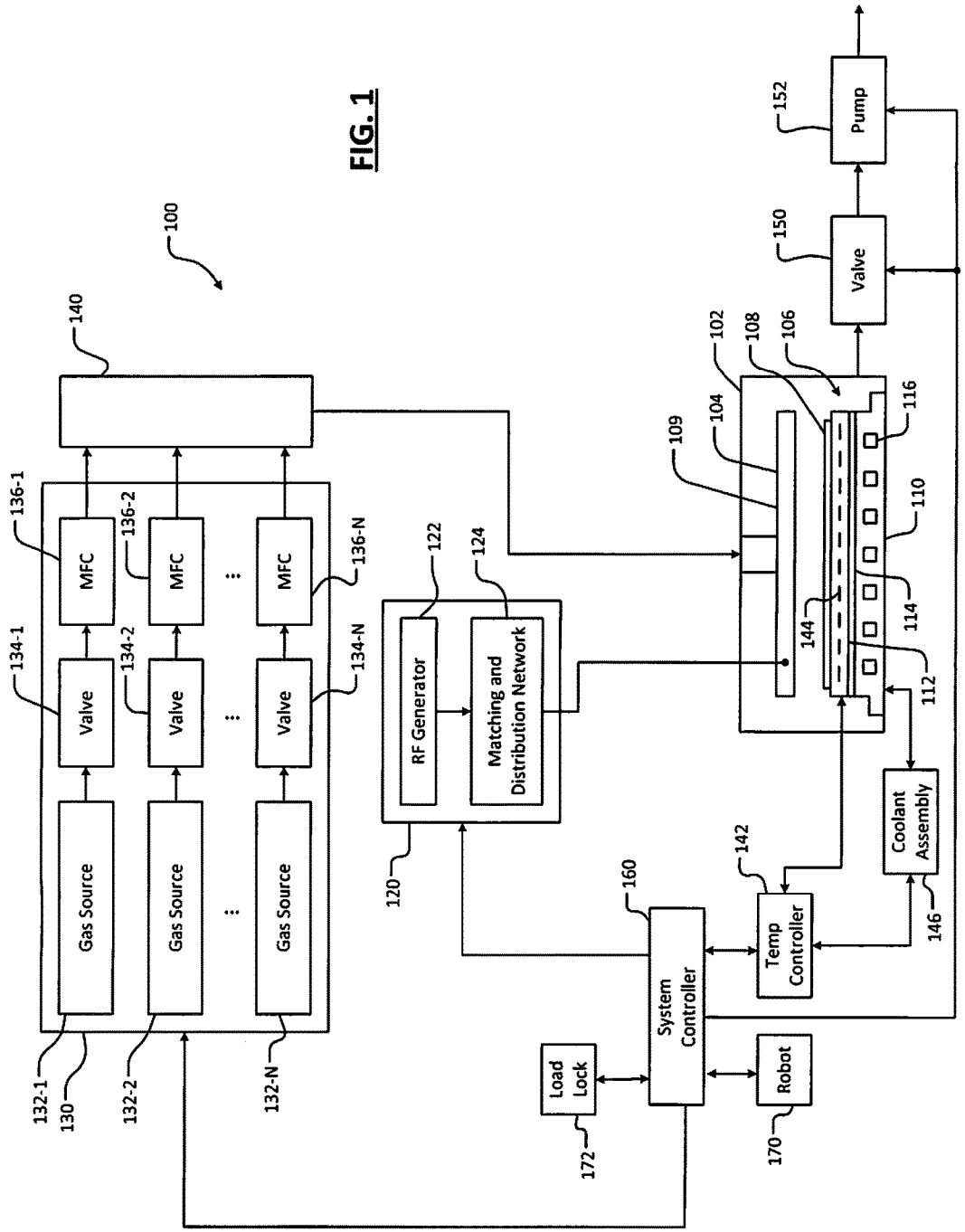
FIG. 1 is a functional block diagram of an example substrate processing system including an electrostatic chuck according to the principles of the present disclosure.

In a substrate processing system, the temperature of a wafer processing substrate, such as an electrostatic chuck (ESC), may be controlled during process steps. For example, different processes and respective steps may require that the substrate is maintained at different temperatures. The contact surface temperature of the ESC may be controlled to maintain the substrate at desired temperatures. For example only, the ESC may include a heating plate (e.g., a ceramic heating plate). The substrate may be arranged on the heating plate. Accordingly, the temperature of the heating plate is controlled to achieve the desired temperatures of the substrate.

Variations in the manufacturing process may cause corresponding variations in the characteristics of the heating plate and the performance of the temperature control of the heating plate. For example, variations (i.e., non-uniformities) may include, but are not limited to, local variations in thicknesses and/or thermal conductivity of layers in the construction of the heating plate, variations in the flatness of machined surfaces, and/or variations in characteristics of respective thermal control elements (TCEs) within the heating plate. These non-uniformities may result in local differences in heat transfer (i.e., local temperature non-uniformity), and therefore non-uniformities in substrate temperatures.

In ESC temperature auto-correction systems and methods according to the principles of the present disclosure, a wafer processing substrate such as an ESC including one or multiple zones (e.g., a multi-zone ESC) may include respective macro TCEs for each zone of a heating plate and a plurality of micro TCEs distributed throughout the heating plate. The macro TCEs are controlled to roughly achieve a desired setpoint temperature in each of the respective zones. However, since each macro TCE adjusts the temperature of an entire respective zone, non-uniformities within each zone may cause corresponding temperature non-uniformities in that zone. These temperature non-uniformities are therefore not correctable merely by adjusting the respective macro TCEs. In some implementations, the wafer processing substrate may not include active TCEs and instead may merely function as a thermal sink.

Accordingly, the plurality of micro TCEs may be individually controlled to compensate for the temperature non-uniformities in each zone of the ESC. For example, a temperature response of each of the macro TCEs on the surface of the ESC (or other data indicative of the temperature non-uniformities) may be known and mapped (i.e., stored in memory). For example, the respective temperature responses may correspond to temperature responses observed when a control parameter (e.g., a power percentage) is maintained at a predetermined value. For example only, such responses may be measured with thermocouples on the surface of the ESC. Similarly, a temperature response of each of the micro TCEs on the surface of the ESC may be known and mapped. When a macro TCE is controlled to a setpoint temperature (by adjusting the control parameter according to feedback from one or more sensors), temperature non-uniformities at that setpoint temperature can be calculated based on the mapped macro TCE temperature responses, which are indicative of temperature non-uniformities on the surface of the ESC. The micro TCEs are then automatically controlled to compensate for known temperature non-uniformities in the macro TCE response at that setpoint temperature.

Although the ESC temperature auto-correction systems and methods are described with respect to a multi-zone ESC, those skilled in the art can appreciate that the principles of the present disclosure may be applied to other temperature-controlled components of a substrate processing system.

Referring now to FIG. 1, an example substrate processing system 100 for performing etching using RF plasma is shown. The substrate processing system 100 includes a processing chamber 102 that encloses other components of the substrate processing chamber 100 and contains the RF plasma. The substrate processing chamber 100 includes an upper electrode 104 and an electrostatic chuck (ESC) 106. During operation, a substrate 108 is arranged on the ESC 106.

For example only, the upper electrode 104 may include a showerhead 109 that introduces and distributes process gases. The showerhead 109 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which process gas or purge gas flows. Alternately, the upper electrode 104 may include a conducting plate and the process gases may be introduced in another manner.

The ESC 106 includes a conductive baseplate 110 that acts as a lower electrode. The baseplate 110 supports a heating plate 112, which may correspond to a ceramic multi-zone heating plate. A thermal resistance layer 114 may be arranged between the heating plate 112 and the baseplate 110. The baseplate 110 may include one or more coolant channels 116 for flowing coolant through the baseplate 110.

An RF generating system 120 generates and outputs an RF voltage to one of the upper electrode 104 and the lower electrode (e.g., the baseplate 110 of the ESC 106). The other one of the upper electrode 104 and the baseplate 110 may be DC grounded, AC grounded or floating. For example only, the RF generating system 120 may include an RF voltage generator 122 that generates the RF voltage that is fed by a matching and distribution network 124 to the upper electrode 104 or the baseplate 110. In other examples, the plasma may be generated inductively or remotely.

A gas delivery system 130 includes one or more gas sources 132-1, 132-2, . . . , and 132-N (collectively gas sources 132), where N is an integer greater than zero. The gas sources supply one or more precursors and mixtures thereof. The gas sources may also supply purge gas. Vaporized precursor may also be used. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 102. For example only, the output of the manifold 140 is fed to the showerhead 109.

A temperature controller 142 may be connected to a plurality of thermal control elements (TCEs) 144 arranged in the heating plate 112. For example, the TCEs 144 may include, but are not limited to, respective macro TCEs corresponding to each zone in a multi-zone heating plate and/or an array of micro TCEs disposed across multiple zones of a multi-zone heating plate as described in more detail in FIGS. 2A and 2B. The temperature controller 142 may be used to control the plurality of TCEs 144 to control a temperature of the ESC 106 and the substrate 108.

The temperature controller 142 may communicate with a coolant assembly 146 to control coolant flow through the channels 116. For example, the coolant assembly 146 may include a coolant pump and reservoir. The temperature controller 142 operates the coolant assembly 146 to selectively flow the coolant through the channels 116 to cool the ESC 106.

A valve 150 and pump 152 may be used to evacuate reactants from the processing chamber 102. A system controller 160 may be used to control components of the substrate processing system 100. A robot 170 may be used to deliver substrates onto, and remove substrates from, the ESC 106. For example, the robot 170 may transfer substrates between the ESC 106 and a load lock 172.

Referring now to FIGS. 2A, 2B, and 2C, an example ESC 200 is shown. A temperature controller 204 communicates with the ESC 200 via one or more electrical connections 208. For example, the electrical connections 208 may include, but are not limited to, connections for selectively controlling macro TCEs 212-1, 212-2, 212-3, and 212-4, referred to collectively as macro TCEs 212, and/or micro TCEs 216 and connections for receiving temperature feedback from one or more zone temperature sensors 220. Although, as shown for example only in FIGS. 2B and 2C, the micro TCEs 216 are aligned with the macro TCEs 212 in a circular, concentric arrangement, other arrangements of the micro TCEs 216 with respect to the macro TCEs 212 may be used.

As shown, the ESC 200 is a multi-zone ESC including zones 224-1, 224-2, 224-3, and 224-4, referred to collectively as zones 224. Although shown with the four concentric zones 224, in embodiments the ESC 200 may include one, two, three, or more than four of the zones 224. The shapes of the zones 224 may vary. For example, the zones 224 may be provides as quadrants or another grid-like arrangement. Each of the zones 224 includes, for example only, a respective one of the zone temperature sensors 220 and a respective one of the macro TCEs 212. In embodiments, each of the zones 224 may more than one of the temperature sensors 220. For example, the ESC 200 includes a baseplate 228 including coolant channels 232, a thermal resistance layer 236 formed on the baseplate 228, and a multi-zone ceramic heating plate 240 formed on the thermal resistance layer 236. The heating plate 240 may include multiple bonded layers, including a first layer 244 as shown in FIG. 2B and a second layer 248 as shown in FIG. 2C. The first layer 244 includes the macro TCEs 212 and the second layer 248 includes the plurality of micro TCEs 216.

The temperature controller 204 controls the macro TCEs 212 and the micro TCEs 216 according to a desired setpoint temperature. For example, the temperature controller 204 may receive (e.g., from the system controller 160 as shown in FIG. 1) a setpoint temperature for one or more of the zones 224. For example only, the temperature controller 204 may receive a same setpoint temperature for all or some of the zones 224 and/or different respective setpoint temperatures for each of the zones 224. The setpoint temperatures for each of the zones 224 may vary across different processes and different steps of each process.

The temperature controller 204 controls the macro TCEs 212 for each of the zones 224 based on the respective setpoint temperatures and temperature feedback provided by the sensors 220. For example, the temperature controller 204 individually adjusts power (e.g., current) provided to each of the macro TCEs 212 to achieve the setpoint temperatures at each of the sensors 220. The macro TCEs 212 may each include a single resistive coil or other structure schematically represented by the dashed lines of FIG. 2B. Accordingly, adjusting one of the macro TCEs 212 affects the temperature of the entire respective zone 224, and may also affect other ones of the zones 224. The sensors 220 may provide temperature feedback for only a local portion of each of the zones 224. For example only, the sensors 220 may be positioned in a portion of each zone 224 previously determined to have the closest correlation to the average temperature of the zone 224.

Conversely, the temperature controller 204 may individually control each of the micro TCEs 216 to locally adjust temperatures of the zones 224. For example, although each micro TCE 216 may be located entirely within one of the zones 224, adjusting a thermal output of any one of the micro TCEs 216 may have a thermal impact across multiple zones 224 and localities of the heating plate 240. Accordingly, one or more of the micro TCEs 216 may be selectively activated and/or deactivated to further adjust temperatures of the zones 224.

ESC temperature auto-correction systems and methods according to the principles of the present disclosure selectively activate one or more of the micro TCEs 216 during process steps to compensate for non-uniformities in the zones 224 of the heating plate 240. For example, the non-uniformities may cause, for a given temperature setpoint, non-uniform temperatures across a respective zone 224. For example, if a setpoint for the zone 224-1 is set to 50° C., actual temperatures in the zone 224-1 may vary (e.g., from 47° C. to 53° C., including local temperatures of 47° C., 48° C., 49° C., etc.), and the temperature feedback provided by the sensor 220 may only indicate the temperature for the zone 224-1 at the location of the sensor 220. Accordingly, adjusting a power percentage of the macro TCE 212-1 to a level corresponding to 50° C. may not result in the entirety of the zone 224-1 being maintained at the desired 50° C.

The non-uniformity of the temperatures across the zones 224 may scale according to the power (e.g., power percentage) provided to the respective macro TCE 212. In other words, as the setpoint temperature of the zone 224 increases or decreases (e.g., while maintaining the temperature of the baseplate 228), the magnitude of the temperature non-uniformities in the zone 224 also increases or decreases. One or more of the micro TCEs 216 are therefore activated to achieve any desired setpoint temperature for the entire zone 224 as described below in more detail. Non-uniformities along an annular path defined by each of the zones 224 may be referred to as azimuthal non-uniformities (i.e., non-uniformity from one point along the annular path to another point along the annular path). For example only, each of the micro TCEs 216 may be identified by a radius r (i.e., a distance from a centerpoint 252) and an angle θ, which corresponds to an azimuthal position within the zone 224.

Figure 3:
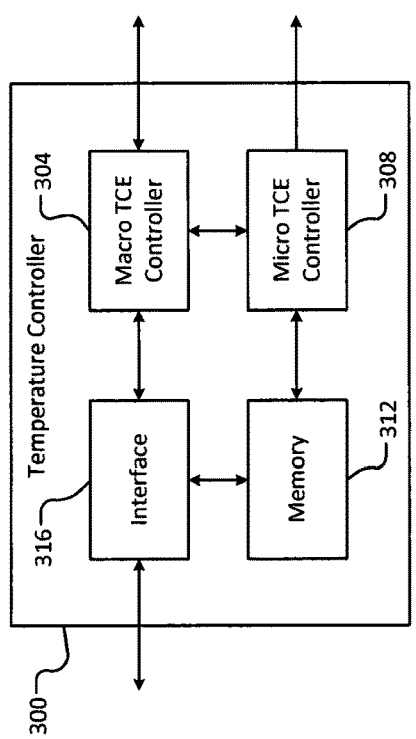
FIG. 3 is an example temperature controller for an electrostatic chuck according to the principles of the present disclosure.

Referring now to FIG. 3 and with reference to FIGS. 2A, 2B, and 2C, a temperature controller 300 includes a macro TCE controller 304 and a micro TCE controller 308, memory 312, and an interface 316 for communicating with, for example, the system controller 160 as shown in FIG. 1. For example, the temperature controller 300 receives setpoint temperatures from the system controller 160 via the interface 316. The interface 316 provides the setpoint temperatures to the macro TCE controller 304. The setpoint temperatures may include a single setpoint temperature for every zone 224 and/or different setpoint temperatures for each of the respective zones 224.

The macro TCE controller 304 controls the macro TCEs 212 according to the received setpoint or setpoints. For example, the macro TCE controller 304 may adjust each macro TCE 212 to the corresponding setpoint, minus an offset. The offset may be the same for each zone 224 or different for one or more of the zones 224. The offset may be, for example only, 5° C. or another predetermined value. In embodiments, the offset may be predetermined based on observed temperature non-uniformities in each of the zones 224. For example, if a minimum observed temperature in a zone 224 for a given setpoint is 2° C. less than the setpoint, the offset may be set at 2° C. or greater than 2° C. In other words, the offset may be set to greater than or equal to a difference between the setpoint and the lowest observed temperature in the zone 224 that is less than the setpoint.

In this manner, if the setpoint is 50° C. and the offset is 5° C., the macro TCE 212 for a zone 224 can be controlled to 45° C. The micro TCEs 216 can then be controlled to achieve the setpoint of 50° C. throughout the zone 224, thereby compensating for temperature non-uniformities in the zone 224. For example, some of the micro TCEs 216 may be controlled to increase the temperature in a portion of the zone 224 by 5° C. (e.g., in a portion of the zone 224 that was observed to correlate exactly to the setpoint temperature). Conversely, others of the micro TCEs 216 may be controlled to increase the temperature in another portion of the zone 224 by 7° C. (e.g., in a portion of the zone 224 that was observed to correlate to 2° C. less than the setpoint temperature). Still others of the micro TCEs 216 may be controlled to increase the temperature in another portion of the zone 224 by 3° C. (e.g., in a portion of the zone 224 that was observed to correlate to 2° C. more than the setpoint temperature). Accordingly, whether the temperature non-uniformities correspond to temperatures less than the setpoint or greater than the setpoint, the micro TCEs 216 can be controlled to achieve the setpoint temperature for the zone 224 to compensate for the non-uniformities.

Control of each micro TCE 216 may be based on (i) a relationship between a calibration setpoint for the macro TCEs 212 and corresponding temperature responses in each of the zones 224, and (ii) a relationship between a power percentage provided to each of the micro TCEs 216 and corresponding temperature responses (e.g., local changes in temperature) in each of the zones 224. Data indicative of the relationships (i) and (ii) may be stored in the memory 312. For example, the data may include the temperature responses of each of the macro TCEs 212 at a calibration setpoint and the temperature responses of each of the micro TCEs 216 at other respective calibration setpoints (which may be equal to or different from the calibration setpoint for the macro TCEs 212). In other words, for (i), temperature responses (which are indicative of temperature non-uniformities) of the macro TCEs 212 in each of the zones 224 for the calibration setpoint (e.g., a first predetermined value of a control parameter, such as a power percentage provided to the macro TCEs 212) may be known/predetermined. Conversely, for (ii), the temperature response of every one of the micro TCEs 216, at respective calibration setpoints (i.e., power percentages), on surrounding portions of each of the zones 224 may be known/predetermined.

Accordingly, for the macro TCE calibration setpoint, the temperature responses in each of the zones 224 when the macro TCEs 212 are controlled to the calibration setpoint are stored in memory 312. Further, the temperature responses of each micro TCE 216 when the micro TCEs 216 are controlled to respective calibration setpoints are also stored in memory 312. For example only, the temperature responses of the macro TCEs 212 and the micro TCEs 216 may be measured using thermocouples or other suitable mechanisms. For example only, the memory 312 may include non-volatile memory such as flash memory.

When a control setpoint for the macro TCEs 212 is selected during operation, resulting temperature non-uniformities for the control setpoint can be calculated (based on the known temperature responses of the macro TCEs 212 at the calibration setpoint) because the temperature non-uniformities (corresponding to the stored temperature responses) scale according to the control setpoint). In other words, as the control setpoint increases with respect to the calibration setpoint, the temperature responses of the macro TCEs 212 and associated temperature non-uniformities also increase. Conversely, as the control setpoint decreases with respect to the calibration setpoint, the temperature responses of the macro TCEs 212 and associated temperature non-uniformities also decrease. In this manner, the micro TCE controller 308 can control the micro TCEs 216 to automatically compensate for the temperature non-uniformities across each of the zones 224 for any macro TCE control setpoint temperature. In embodiments, the temperature non-uniformities may not scale with the control setpoint in a linear fashion. Nonetheless, if the scaling response is known (i.e., an amount the temperature response for a given macro TCE changes as the control setpoint increases or decreases from the calibration setpoint), the temperature response, and therefore the temperature non-uniformities at various control setpoints, can still be calculated using the temperature response measured at the calibration setpoint.

In embodiments, the micro TCE controller 308 calculates the temperature non-uniformities at the control setpoint using the data (e.g., the temperature responses for the macro TCEs 212) stored in the memory. For example, the micro TCE controller 308 may multiply the temperature responses stored for the calibration setpoint by a multiplier corresponding to the control setpoint. The multiplier may be a value that scales (e.g., increases or decreases) according to a difference between the calibration setpoint and the control setpoint. For example, the multiplier may be 1 when the control setpoint is equal to the calibration setpoint. Conversely, the multiplier may increase (for example only, to 1.1, 1.2, 1.3, etc.) as the control setpoint increases with respect to the calibration setpoint and decrease (for example only, to 0.90, 0.80, 0.70) etc. as the control setpoint decreases with respect to the calibration setpoint. In this manner, the micro TCE controller 308 calculates the temperature non-uniformities at a given control setpoint based on the stored temperature responses at the calibration setpoint and a multiplier corresponding to the control setpoint. In other embodiments, the response may not scale linearly with the control setpoint. But once the relationship between the response and the control setpoint is measured, the temperature response at a given control setpoint can be calculated based on the stored temperature response at the calibration setpoint and this relationship.

The micro TCE controller 308 can then control the micro TCEs 216 according to the temperature responses stored for the micro TCEs 216 and the calculated temperature non-uniformities. For example, the micro TCE controller 308 automatically adjusts a power percentage of respective micro TCEs 216 to compensate for the calculated temperature non-uniformities according to the stored temperature responses. In this manner, the micro TCEs 216 are controlled to achieve a uniform temperature (e.g., the control setpoint temperature) by compensating for the calculated temperature non-uniformities at the control setpoint.

In other embodiments, previously determined profiles (e.g., power percentages) of each of the micro TCEs 216 for each setpoint temperature received for the zones 224 may be stored in the memory 312. For example, each of the micro TCEs 216 may be controlled to contribute from 0° C. (at 0% power) to 5° C. (at 100% power), 0° C. to 10° C., 0° C. to 20° C., 0° C. to a peak temperature, etc., to localities of each of the zones 224. Accordingly, when the macro TCE controller 304 receives setpoint temperatures for one or more of the zones 224 and controls the corresponding macro TCEs 212 based on the setpoints (e.g., to a setpoint minus the offset), the micro TCE controller 308 may also receive the setpoint temperatures (e.g., from the macro TCE controller 304 and/or directly from the interface 316). The micro TCE controller 308 can then retrieve respective profiles for each of the micro TCEs 216 and control the micro TCEs 216 accordingly.

In other embodiments, the profiles may include different power percentages, for each micro TCE 216, for each setpoint, and/or may include a single percentage value that is automatically adjusted according to the setpoint temperature. For example, if a temperature non-uniformity is observed to be a percentage of the setpoint (e.g., 5% greater than the setpoint), then the power percentage for a given setpoint may correspond to a baseline percentage P multiplied by the setpoint. In other embodiments, the profiles may simply include different temperature demands (e.g., from 0-10° C.) for each of the micro TCEs 216, for each setpoint.

A simplified example is described with reference to FIG. 4. Those skilled in the art can appreciate that the values in the example are chosen merely for illustrative purposes. For example only, a region 400 may include a single temperature non-uniformity at 404 in a zone 408. For example only, for a setpoint of 50° C., the non-uniformity 404 may correspond to a temperature of 46° C. Assuming an offset of 5° C. (and therefore a controlled temperature of 45° C.), a default power percentage to each of micro TCEs 412 to achieve the setpoint of 50° C. may be 10%. However, a micro TCE 412 nearest to the non-uniformity 404 may be provided with 50% power to compensate for the 4° C. difference of the non-uniformity 404 based on a known temperature response of that micro TCE 412. Conversely, power to other micro TCEs 412 may be adjusted downward to compensate for the thermal response of the micro TCE 412 powered at 50% on other areas of the zone 408 and an adjacent zone 416. In other words, nearby micro TCEs 412 may be controlled at a percentage lower than the default percentage to avoid increasing the temperature above the setpoint. For example, temperature responses of each of the micro TCEs 412 may overlap with nearby others of the micro TCEs 412. Accordingly, control of respective micro TCEs 412 may be adjusted to account for overlap with the temperature responses of adjacent micro TCEs 412.

Figure 4:
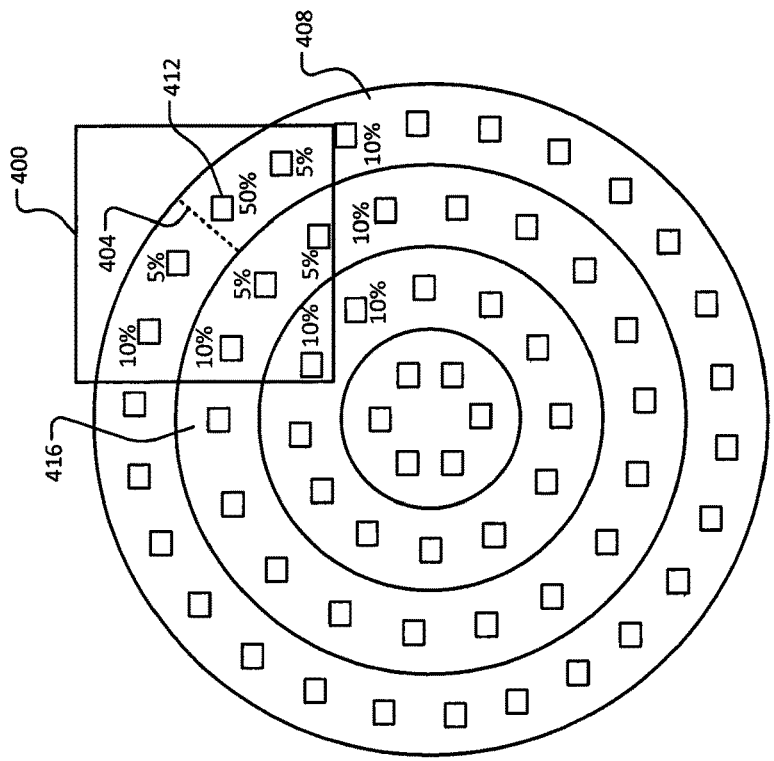
FIG. 4 illustrates an example temperature non-uniformity in a region of an electrostatic chuck according to the principles of the present disclosure.

Those skilled in the art can appreciate that the example of FIG. 4 is only one possible, simplified relationship between a given setpoint, temperature non-uniformities, and the control of the micro TCEs 412. The overall relationships may be complex and various temperature non-uniformities may require multiple ones of the micro TCEs 412 to be adjusted upward or downward, based on the profiles stored in the memory 312, to automatically achieve a uniform setpoint temperature throughout the zones of the ESC.

Figure 5:
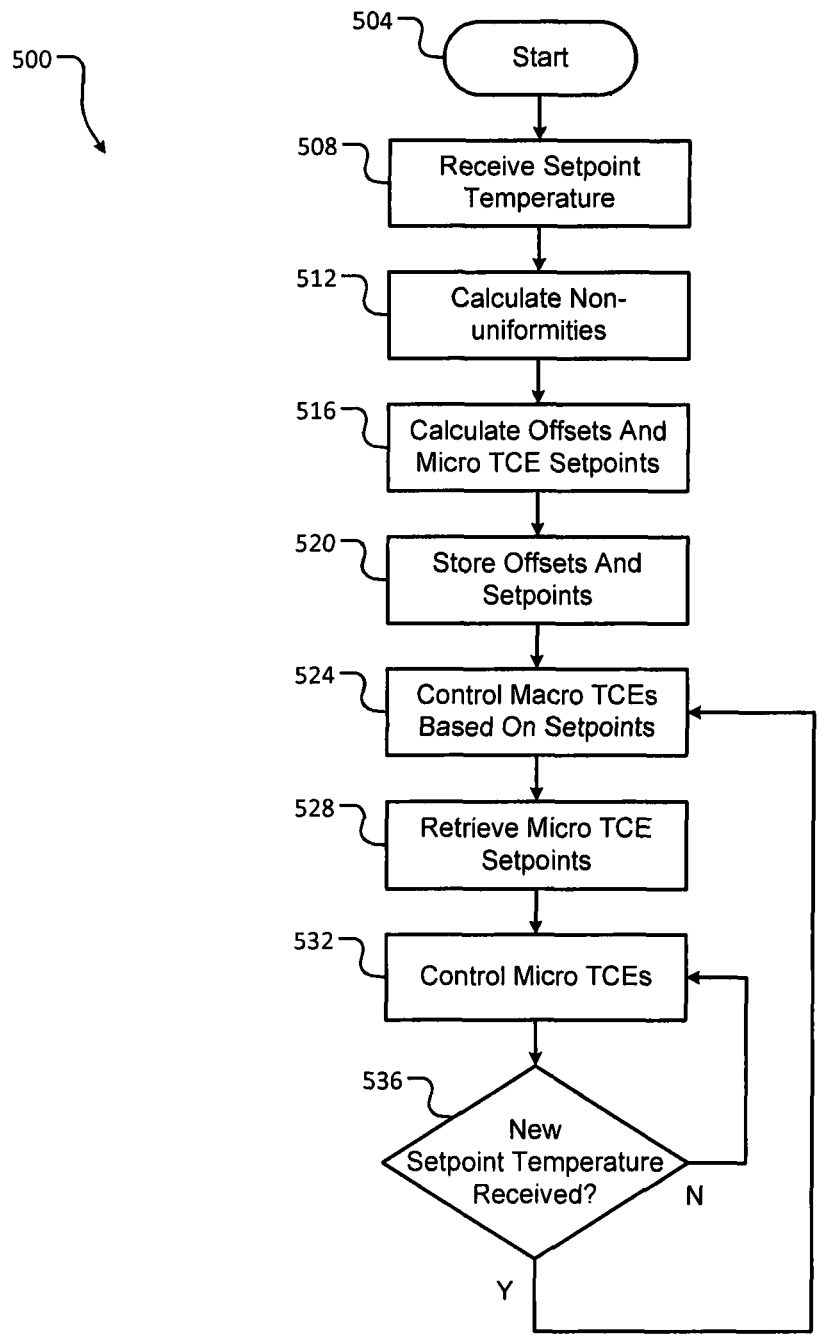
FIG. 5 illustrates steps of an example electrostatic chuck temperature auto-correction method according to the principles of the present disclosure.

Referring now to FIG. 5, an example ESC temperature auto-correction method 500 begins at 504. At 508, a temperature controller receives the desired setpoint temperatures (e.g., control setpoints) for respective zones (and corresponding macro TCEs) of the ESC. At 512, temperature non-uniformities for an ESC (e.g., temperature non-uniformities corresponding to temperature non-uniformities in a multi-zone heating plate of the ESC) are calculated. For example, the temperature non-uniformities are calculated according to stored data indicative of temperature responses of the macro TCEs at a calibration setpoint and a multiplier corresponding to the desired setpoint temperature. At 516, offsets for the macro TCEs (e.g., an adjusted setpoint offset from the setpoint temperature) and respective setpoints (e.g., required power percentages and/or temperature demands) for each of the micro TCEs are calculated based on the temperature non-uniformities. For example, the power percentages and/or temperature demands correspond to a desired temperature response provided by each micro TCE to compensate for the temperature non-uniformities. At 520, the calculated setpoints for each of the macro TCEs and the micro TCEs are stored in memory based on the calculated offsets, the, calculated power percentages, and/or the calculated temperature demands.

At 524, the temperature controller controls macro TCEs corresponding to the zones of the ESC based on the adjusted setpoint temperatures. For example, the temperature controller controls the macro TCEs to the adjusted setpoint that corresponds to the desired setpoint temperature minus the offset. At 528, the temperature controller retrieves, from the memory, the setpoints for each of the micro TCEs. At 532, the temperature controller controls the micro TCEs based on the setpoints retrieved from memory. At 536, the method 500 determines whether the temperature controller received a new desired setpoint temperature. If true, the method 500 continues to 512. If false, the method 500 continues to 532.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A system for controlling a temperature of a wafer processing substrate, wherein the wafer processing substrate includes at least one first thermal control element arranged within the wafer processing substrate and a plurality of second thermal control elements arranged throughout the wafer processing substrate, the system comprising:
    memory that stores first temperature responses of the at least one first thermal control element, wherein the first temperature responses correspond to temperature responses as observed in the at least one first thermal control element in response to a first control parameter of the at least one first thermal control element being maintained at a predetermined first value, wherein the first control parameter corresponds to an input for adjusting the at least one first thermal control element;
    a first controller configured to receive a setpoint temperature for the wafer processing substrate and maintain the first control parameter of the at least one first thermal control element at a second value different from the predetermined first value based on the received setpoint temperature; and
    a second controller configured to
    retrieve the first temperature responses from the memory,
    calculate temperature non-uniformities associated with the wafer processing substrate at the second value using (i) the first temperature responses corresponding to the temperature responses as observed in response to the first control parameter being maintained at the predetermined first value retrieved from the memory and (ii) the second value based on the received setpoint temperature, and
    control the plurality of second thermal control elements based on the calculated non-uniformities at the second value, wherein the at least one first thermal control element and the plurality of second thermal control elements are electrical thermal control elements, and wherein controlling the plurality of second thermal control elements includes controlling electrical setpoints of the plurality of second thermal control elements.

2. The system of claim 1, wherein the memory stores second temperature responses of the plurality of second thermal control elements when respective second control parameters of the plurality of second thermal control elements are maintained at respective predetermined second values.

3. The system of claim 1, wherein the first control parameter corresponds to a percentage of power provided to the at least one first thermal control element.

4. The system of claim 1, wherein the wafer processing substrate corresponds to an electrostatic chuck (ESC), and wherein the temperature non-uniformities correspond to temperature non-uniformities on a surface of the ESC.

5. The system of claim 1, wherein the temperature non-uniformities correspond to portions of a heating plate of the wafer processing substrate that have a temperature different from the setpoint temperature when the heating plate is controlled to the setpoint temperature.

6. The system of claim 1, wherein the first controller controls the at least one first thermal control element based on the setpoint temperature minus an offset.

7. The system of claim 6, wherein the offset is calculated based on the temperature non-uniformities.

8. A method for controlling a temperature of a wafer processing substrate, wherein the wafer processing substrate includes at least one first thermal control element arranged within the wafer processing substrate and a plurality of second thermal control elements arranged throughout the wafer processing substrate, the method comprising:

storing, in memory, first temperature responses of the at least one first thermal control element, wherein the first temperature responses correspond to temperature responses as observed in the at least one first thermal control element in response to a first control parameter of the at least one first thermal control element being maintained at a predetermined first value, wherein the first control parameter corresponds to an input for adjusting the at least one first thermal control element;

receiving a setpoint temperature for the wafer processing substrate and maintaining the first control parameter of the at least one first thermal control element at a second value different from the predetermined first value based on the received setpoint temperature;

retrieving the first temperature responses from the memory;

calculating temperature non-uniformities associated with the wafer processing substrate at the second value using (i) the first temperature responses corresponding to the temperature responses as observed in response to the first control parameter being maintained at the predetermined first value retrieved from the memory and (ii) the second value based on the received setpoint temperature; and controlling the plurality of second thermal control elements based on the calculated non-uniformities at the second value, wherein the at least one first thermal control element and the plurality of second thermal control elements are electrical thermal control elements, and wherein controlling the plurality of second thermal control elements includes controlling electrical setpoints of the plurality of second thermal control elements.

9. The method of claim 8, further comprising storing second temperature responses of the plurality of second thermal control elements when respective second control parameters of the plurality of second thermal control elements are maintained at respective predetermined second values.

10. The method of claim 8, wherein the first control parameter corresponds to a percentage of power provided to the at least one first thermal control element.

11. The method of claim 8, wherein the wafer processing substrate corresponds to an electrostatic chuck (ESC), and wherein the temperature non-uniformities correspond to temperature non-uniformities on a surface of the ESC.

12. The method of claim 8, wherein the temperature non-uniformities correspond to portions of a heating plate of the wafer processing substrate that have a temperature different from the setpoint temperature when the heating plate is controlled to the setpoint temperature.

13. The method of claim 8, wherein controlling the at least one first thermal control element includes controlling the at least one first thermal control elements based on the setpoint temperature minus an offset.

14. The method of claim 13, wherein the offset is calculated based on the temperature non-uniformities.

* * * * *